United States Patent
Baek et al.

(10) Patent No.: US 6,936,931 B2
(45) Date of Patent: Aug. 30, 2005

(54) OVERLAY KEY, METHOD OF MANUFACTURING THE SAME AND METHOD OF MEASURING AN OVERLAY DEGREE USING THE SAME

(75) Inventors: Kyoung-Yoon Baek, Anyang (KR); Young-Guk Bae, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 212 days.

(21) Appl. No.: 10/043,329

(22) Filed: Jan. 14, 2002

(65) Prior Publication Data

US 2002/0127483 A1 Sep. 12, 2002

(30) Foreign Application Priority Data

Mar. 8, 2001 (KR) .......................................... 2001-12005

(51) Int. Cl.$^7$ .................... H01L 23/544; G03F 9/00; G03C 5/00; G03B 27/00
(52) U.S. Cl. ............................. 257/797; 430/5; 430/30; 355/18
(58) Field of Search ...................... 430/5, 30; 257/797; 355/18

(56) References Cited

U.S. PATENT DOCUMENTS

| | | | | |
|---|---|---|---|---|
| 6,529,282 B1 | * | 3/2003 | Stirton et al. | 356/630 |
| 6,573,986 B2 | * | 6/2003 | Smith et al. | 356/124 |
| 6,620,557 B1 | * | 9/2003 | Hosono et al. | 430/5 |
| 6,656,644 B2 | * | 12/2003 | Hasegawa et al. | 430/5 |

* cited by examiner

*Primary Examiner*—Long Pham
*Assistant Examiner*—Shrinivas H. Rao
(74) *Attorney, Agent, or Firm*—Volentine Francos&Whitt, PLLC

(57) ABSTRACT

An overlay key includes a first overlay key having a first main overlay pattern and a first auxiliary pattern, and a second overlay key having a second main overlay pattern and a second auxiliary overlay pattern, the second auxiliary overlay pattern formed at a location corresponding to the first auxiliary overlay pattern.

31 Claims, 18 Drawing Sheets

OVERLAY KEY, METHOD OF MANUFACTURING THE SAME AND METHOD OF MEASURING AN OVERLAY DEGREE USING THE SAME

The present application claims priority under 35 U.S.C. §119 to Korean Patent Application No. 2001-12005, filed on Mar. 8, 2001, which is hereby incorporated by reference in its entirety for all purposes.

BACKGROUND OF THE INVENTION

1. Field of the Invention

The present invention relates to an overlay key for use in a semiconductor device, a method of manufacturing the same and a method of measuring an overlay degree using the same.

2. Description of the Related Art

As semiconductor devices have become more highly integrated, a density of patterns formed on a wafer has become greater. In particular, cell region pattern density has become greater than in peripheral regions.

Components in the cell region and/or the peripheral region are formed by repeatedly performing a deposition process and a patterning process. In such patterning processes or photolithography processes, one of the most important parameters is an overlay degree that represents how accurate a currently formed layer in a current process step is formed on a previously formed layer in a previous process step. An overlay key is used to measure such an overlay degree, that is a degree of misalignment between a currently formed layer and a previously formed layer.

FIGS. 1A to 1C are plan views illustrating a conventional overlay key. The overlay key 100 includes first and second overlay keys 10 and 15. An overlay degree between the previously formed layer and the currently formed layer can be measured by measuring a distance between the first and second overlay keys 10 and 15. Typically, in order to measure a distance between the first and second overlay keys 10 and 15, an optical method is used that measures, using an optical microscope, an optical contrast difference between the first overlay key 10 formed in a previous process step and the second overlay key 15 formed in a current process step.

A method of measuring an overlay degree using the conventional overlay key is explained in detail with reference to FIGS. 2A and 2B as follows. In FIG. 2A, reference numeral 5 represents a range to be measured by an overlay measuring apparatus (not shown). The range 5 to be measured is confined to a portion (e.g., see 11 in FIG. 1C) that is defined by imaginary lines extended outwardly from two parallel outside lines of the second overlay key 15, and that corresponds to respective sides of the second overlay key 15.

FIG. 2B is a cross-sectional view taken along line 2B—2B of FIG. 2A. As shown in FIG. 2B, after positioning the overlay measuring apparatus over the overlay key 100, light 106 is irradiated toward the overlay key 100. Light 106 irradiated toward the overlay key 100 is reflected from the overlay keys 10 and 15 and then is directed toward an optical sensor of the overlay measuring apparatus. However, irradiated light incident on both edges of the overlay keys 10 and 15 is scattered, and thus a small amount of reflected light is directed from the edges of the overlay keys 10 and 15 to the optical sensor of the overlay measuring apparatus. As a result, light detected by the optical sensor has a waveform S as shown in FIG. 2B. As can be seen in the waveform S, a degree of misalignment, or an overlay degree, can be measured by measuring distances d1 and d2 between the first and second overlay keys 10 and 15. That is, an overlay degree is "(d1−d2)/2".

In the conventional overlay measuring method, since the second overlay key 15 is made of a photoresist, light reflected from the second overlay key 15 is very high in contrast when read by the overlay measuring apparatus, so that the second overlay key 15 has high measuring reliability. However, since several process steps may occur after formation of the first overlay key 10, a contrast of light reflected from the first overlay key 10 is relatively low, and therefore the first overlay key 10 has low measuring reliability.

Also, in the case of forming a metal layer on the structure, a subsequent overlay measurement may not be accurate due to the presence of metal grains. A metal layer may be asymmetrically deposited on the overlay keys. Accordingly, a measuring reliability of an overlay degree may be further lowered.

As described above, in the case that measuring reliability is low, measuring error may become large. Also, in order to confirm an overlay degree, a wafer should be vertically cut and then inspected using a scanning electron microscope (SEM). There is however a problem in that the wafer having a vertically cut cross-section cannot be used again.

SUMMARY OF THE INVENTION

The present invention is therefore directed to an overlay key and method of manufacture thereof, and a method of measuring an overlay degree, which substantially overcome one or more of the problems due to the limitations and disadvantages of the related art.

To overcome the problems described above, it is an object of the present invention to provide an overlay key having high measuring reliability.

It is another object of the present invention to provide an overlay key that can measure overlay degree during a manufacturing process.

It is a still further object of the present invention to provide a method of measuring overlay degree that can provide high measuring reliability.

It is another further object of the present invention to provide a method of measuring overlay degree during a manufacturing process.

In order to achieve the above and other objects, the present invention provides an overlay key including a first overlay key having a first main overlay pattern and a first auxiliary pattern, and a second overlay key having a second main overlay pattern and a second auxiliary overlay pattern, the second auxiliary overlay pattern being formed at a location corresponding to the first auxiliary overlay pattern.

The present invention also provides an overlay key including a first overlay key including a first main overlay pattern and a first auxiliary overlay pattern, and a second overlay key including a second main overlay pattern and a second auxiliary overlay pattern, wherein the first and second auxiliary overlay patterns are formed at a location where the first and second main overlay patterns do not correspond to each other.

The present invention further provides a method of manufacturing an overlay key. The method includes forming a first overlay key on a wafer, the first overlay key including a first main overlay pattern and a first auxiliary overlay pattern; forming an intermediate layer over the whole surface of the wafer; forming a second overlay key on wafer, the second overlay key including a second main overlay pattern and a second auxiliary overlay pattern, the second auxiliary overlay pattern being formed at a location corresponding to the first auxiliary overlay pattern; and etching the intermediate layer using the second auxiliary overlay pattern as a mask, so that the second auxiliary overlay pattern is copied to the intermediate layer.

The present invention provides a method of measuring an overlay degree including providing an overlay key including first and second overlay keys, the first overlay key including a first main overlay pattern and a first auxiliary overlay pattern, the second overlay key including a second main overlay pattern and a second auxiliary overlay pattern, the first auxiliary overlay pattern being formed at a location corresponding to the second auxiliary overlay pattern; measuring firstly a first overlay degree using the first and second main overlay patterns; measuring secondly a second overlay degree using the first and second auxiliary overlay patterns; and comparing the first and second overlay degrees with each other.

The first and second main overlay patterns may be used to measure an overlay degree using an optical microscope, and the first and second auxiliary overlay patterns may be used to measure an overlay degree using an in-line SEM.

The first and second overlay keys may have a frame shape. The first auxiliary overlay pattern may be formed at a corner portion of the first overlay key. A length of the first main overlay pattern may be equal to a length of a corresponding side of the second main overlay pattern. The first main overlay pattern is defined by imaginary lines extended from two parallel outside lines of the second main overlay pattern. The first auxiliary overlay pattern may include a plurality of bar patterns spaced apart from each other. The second auxiliary overlay pattern may include a plurality of hole patterns spaced apart from each other. An interval between the two adjacent bar patterns may be larger than a width of the hole pattern. The first auxiliary overlay pattern may include a plurality of first bar patterns and the second auxiliary overlay pattern may include a plurality of second bar patterns having a smaller width than the first bar patterns. The first auxiliary overlay pattern may include a plurality of hole patterns. The second auxiliary overlay pattern may include a plurality of bar patterns. A width of the hole pattern of the first auxiliary overlay pattern may be larger than that of the bar pattern of the second auxiliary overlay pattern. The the first and second overlay keys may have a substantially rectangular shape.

Since the overlay key includes the main overlay patterns that can be used to measure an overlay degree using an optical method, and the auxiliary overlay patterns that can be used to measure an overlay degree using an in-line SEM, overlay degree can be very accurately measured, and also during a manufacturing process.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENTS

Figure 3A:
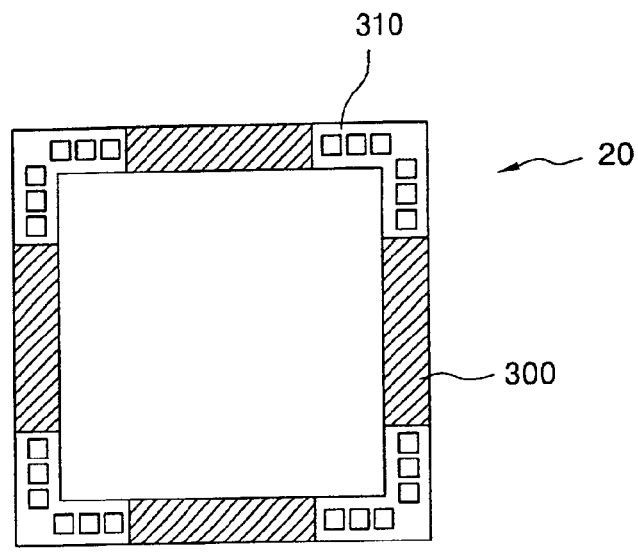
FIGS. 3A to 3C are plan views illustrating an overlay key according to a first embodiment of the present invention.
Figure 3B:
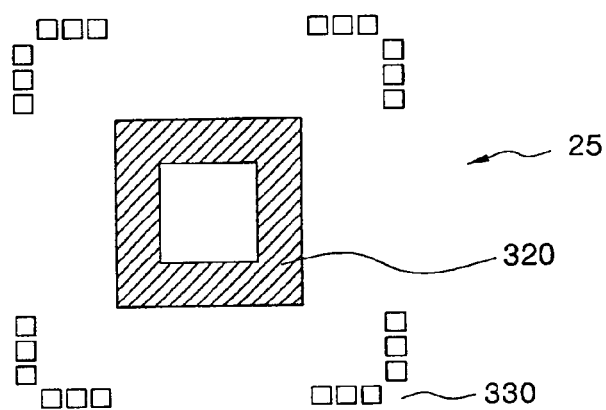
Figure 3C:
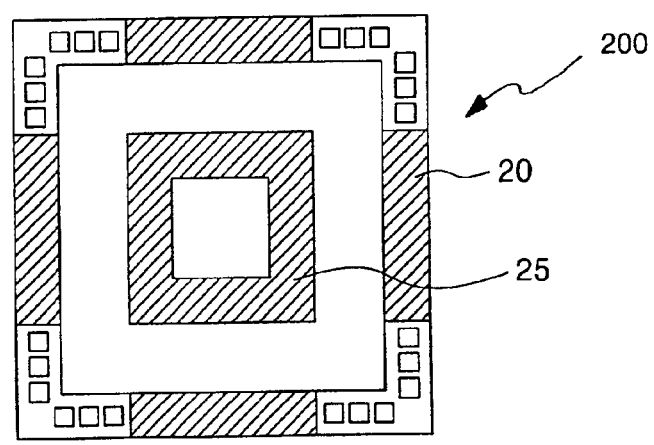

FIGS. 3A to 3C are plan views illustrating an overlay key according to a first embodiment of the present invention. The inventive overlay key 200 includes first and second overlay keys 20 and 25. The first and second overlay keys 20 and 25 have a frame shape. However, a shape of the first and second overlay keys 20 and 25 is not limited in the present invention. The first overlay key 20 includes a first main overlay pattern 300 and a first auxiliary overlay pattern 310. The second overlay key 25 also includes a second main overlay pattern 320 and a second auxiliary overlay pattern 330.

The first main overlay pattern 300 of the first overlay key 20 is formed on a portion of the first overlay key 20 that is defined by imaginary lines extended outwardly from two parallel outside lines of the second overlay key 25 and that corresponds to respective sides of the second overlay key 25. That is, the first auxiliary overlay pattern 310 is formed at a corner portion of the first overlay key 20. A length of the first main overlay pattern 300 may be equal to or larger than a length of a corresponding side of the second main overlay pattern 320. Also, the second auxiliary overlay pattern 330 is formed at a location corresponding to the first auxiliary overlay pattern 310.

Therefore, as shown in FIG. 3C, when the first and second overlay keys 20 and 25 are aligned with each other, the first main overlay pattern 300 corresponds to the second main overlay pattern 320, and the first auxiliary overlay pattern 310 corresponds to the second auxiliary overlay pattern 330.

At this point, the first and second main overlay patterns 300 and 320 are used to measure, using the overlay measuring apparatus, a degree of misalignment of the first and second overlay keys, i.e., an overlay degree between a previously formed layer and a currently formed layer. The first and second auxiliary overlay patterns 310 and 330 are used to measure, using an in-line SEM, an overlay degree between the first and second overlay keys 20 and 25.

That is, in order to measure an overlay degree, the present invention relies not only on an optical method that uses an optical microscope of an overlay measuring apparatus, but also relies on inspection using an in-line SEM. An overlay degree measured by the optical method and an overlay degree measured using the in-line SEM are compared to each other, and therefore, an overlay degree can be measured more accurately, providing high measuring reliability.

Figure 4A:
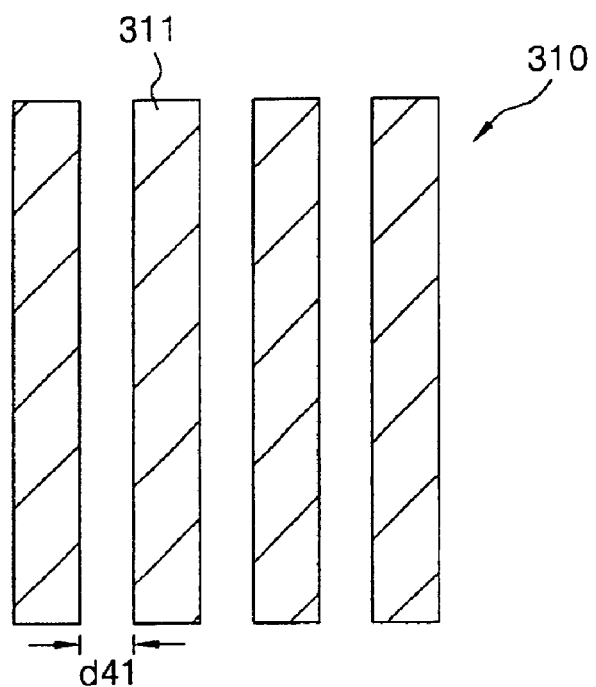
FIGS. 4A to 4C are plan views illustrating a first embodiment of first and second auxiliary overlay patterns according to an embodiment of the present invention.
Figure 4B:
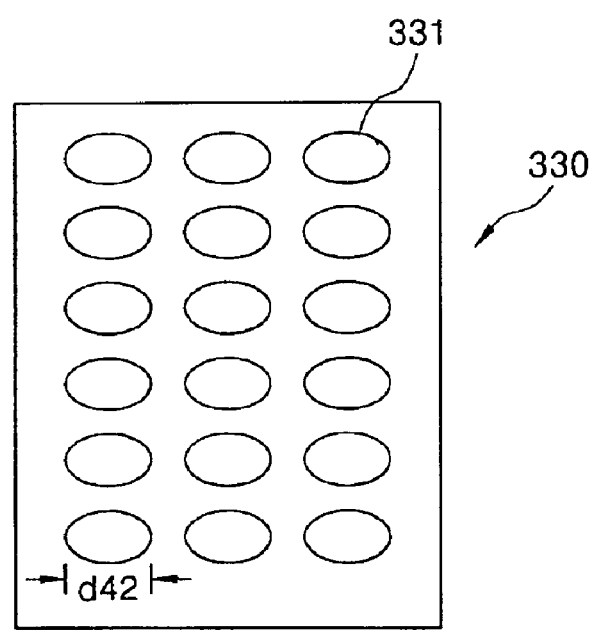
Figure 4C:
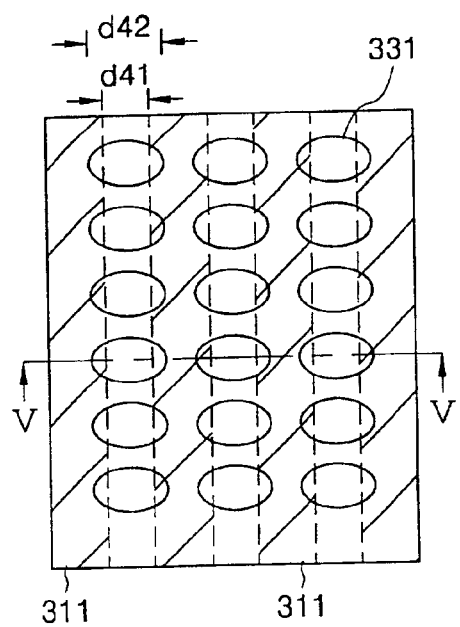

FIGS. 4A to 4C are plan views illustrating a first embodiment of the first and second auxiliary overlay patterns according to the present invention. FIG. 4A is a plan view illustrating the first auxiliary overlay pattern. As shown in FIG. 4A, the first auxiliary overlay pattern 310 includes a plurality of bar patterns 311, which are spaced apart from each other at a regular interval d41.

FIG. 4B is a plan view illustrating the second auxiliary overlay pattern. As shown in FIG. 4B, the second auxiliary overlay pattern 330 includes a plurality of hole patterns 331, which are spaced apart from each other at a regular interval. The hole pattern 331 has a width d42. Preferably, the width d42 of the hole patterns 331 of the second auxiliary overlay pattern 330 is larger than the interval d41 between adjacent bar patterns 331 of the first auxiliary overlay pattern 310.

As shown in FIG. 4C, when the first auxiliary overlay pattern 310 is aligned with the second auxiliary overlay pattern 330, in order to measure an overlay degree or overlay accuracy, distances from both edges of the hole pattern 331 of the second auxiliary overlay pattern 330 to both edges of the bar pattern 311 of the first auxiliary overlay pattern 310 are, respectively, measured.

Figure 5A:
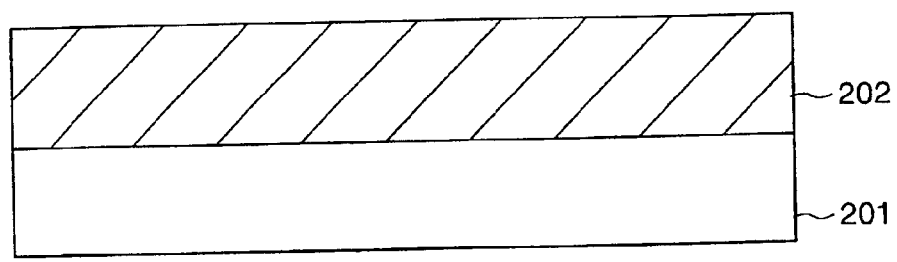
FIGS. 5A to 5E are processing views illustrating a process of manufacturing the overlay key according to an embodiment of the present invention.

FIGS. 5A to 5E are cross-sectional views taken along line V—V of FIG. 4C, illustrating a process of manufacturing the overlay key according to the present invention. First, as shown in FIG. 5A, a lower layer 202 is deposited on a wafer 201.

Figure 5B:
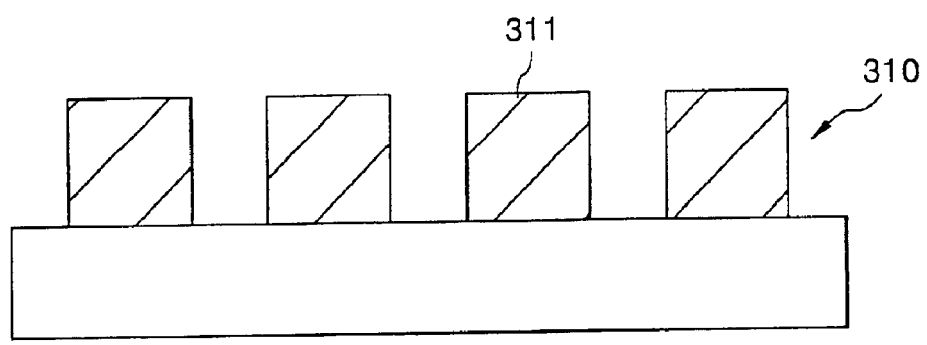

As shown in FIG. 5B, by use of a mask to form the first overlay key 20 (not shown), the lower layer is patterned to form the first overlay key 20 having the first main overlay pattern 300 (not shown) and the first auxiliary overlay pattern 310. The first auxiliary overlay pattern 310 includes a plurality of the bar patterns 311.

Figure 5C:
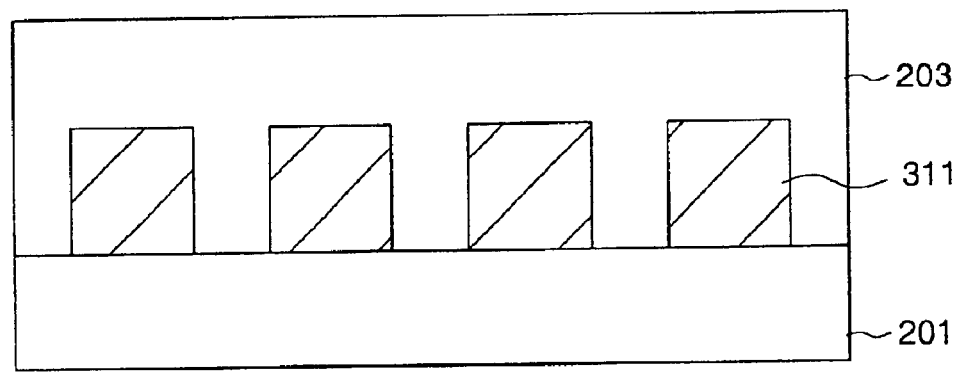

Then, as shown in FIG. 5C, an interlayer insulator 203 is deposited over the whole surface of the wafer 201 and covers a plurality of the bar patterns 311. At this point, only the interlayer insulator 203 is deposited over the wafer 201 in FIG. 5C, but several subsequent processes can be performed until the second overlay key 25 is formed.

Figure 5D:
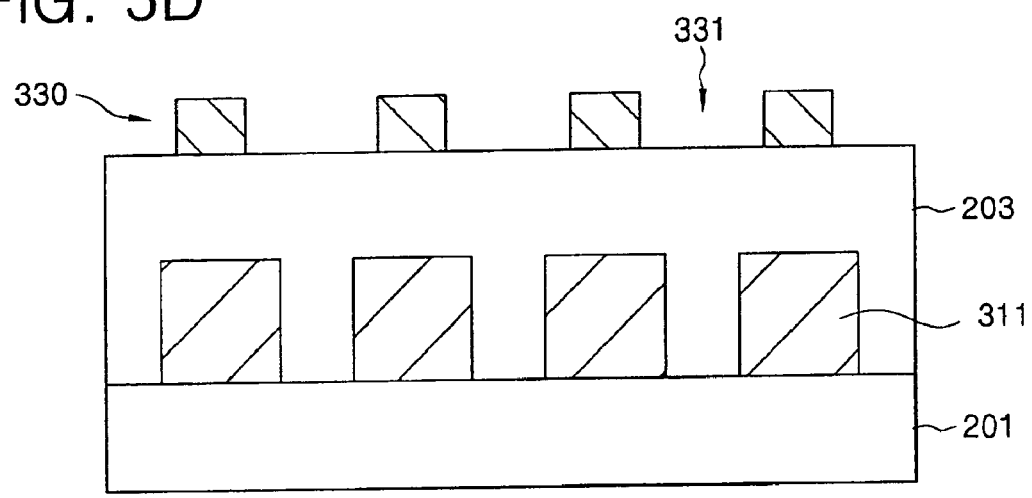

Thereafter, as shown in FIG. 5D, a photoresist is coated on the whole surface of the interlayer insulator 203. A mask (not shown) is used to form the second overlay key 25, and the photoresist is patterned to form the second overlay key 25 having the second main overlay pattern 320 (not shown) and the second auxiliary overlay pattern 330. The second auxiliary overlay pattern 330 includes a plurality of the hole patterns 331. The second auxiliary overlay pattern 330 is formed at a location corresponding to the first auxiliary overlay pattern 310.

Figure 5E:
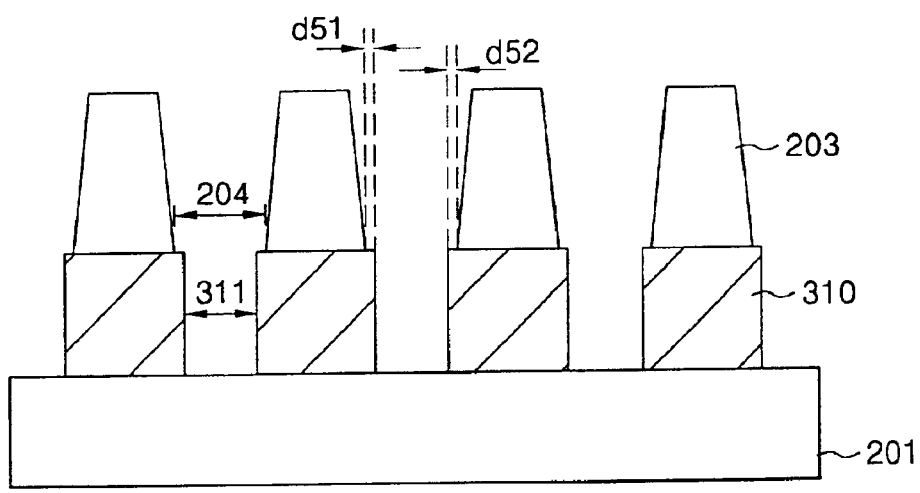

Finally, as shown in FIG. 5E, in order to measure a degree of misalignment between the first and second overlay keys 20 and 25 using the in-line SEM, the interlayer insulator 203 is etched. That is, the interlayer insulator 203 is etched using the second auxiliary overlay pattern 330 as a mask, so that the second auxiliary overlay pattern 330 may be copied to the interlayer insulator 203. Therefore, the interlayer insulator 203 comes to have contact hole patterns 204 corresponding to the hole patterns 331 of the second auxiliary overlay pattern 330.

Figure 1A:
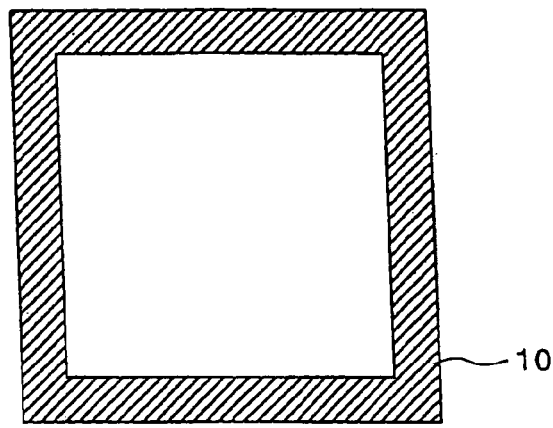
FIGS. 1A to 1C are plan views illustrating a conventional overlay key.
Figure 1B:
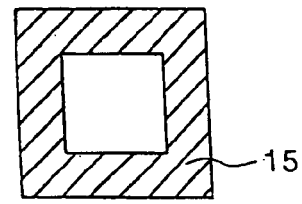
Figure 1C:
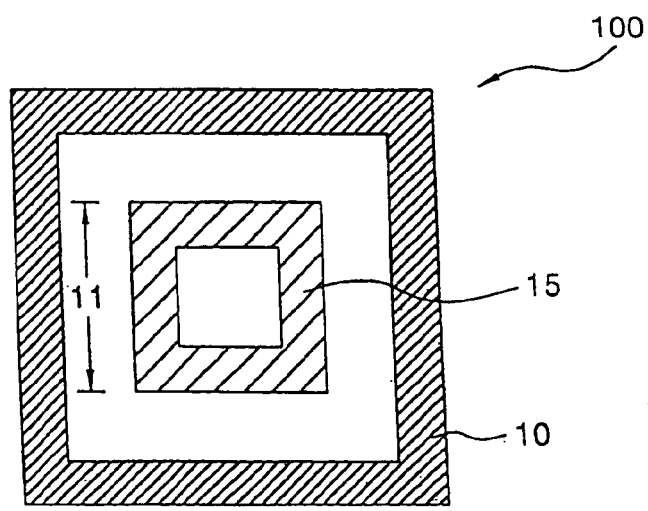
Figure 2A:
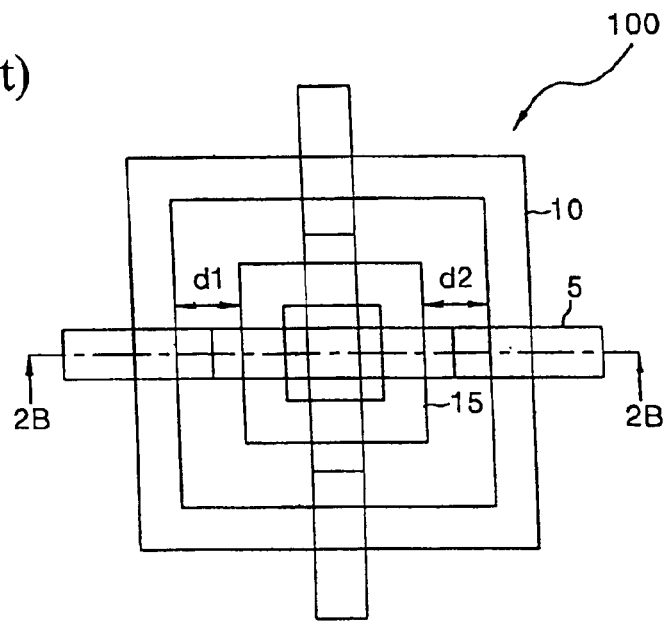
FIGS. 2A and 2B show a method of measuring an overlay degree using the conventional overlay key.
Figure 2B:
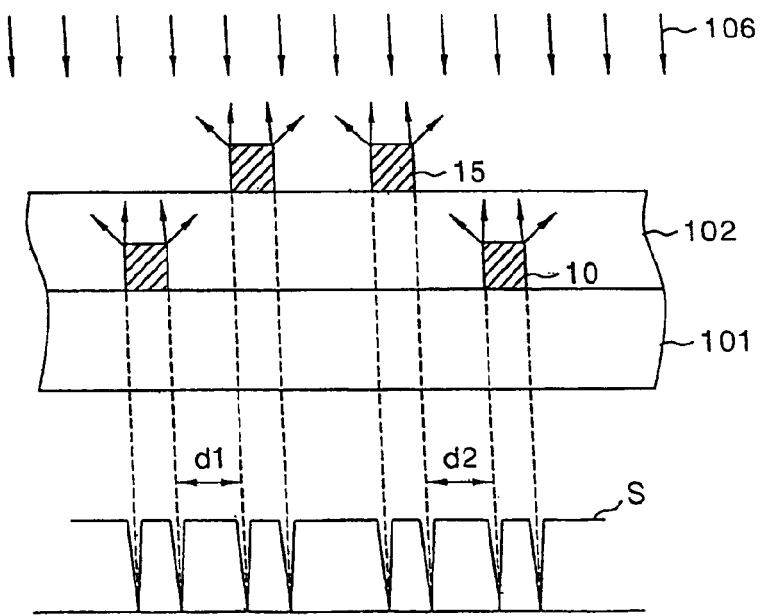

The method of measuring an overlay degree according to this embodiment of the present invention is as follows. First, as shown in FIGS. 2A and 2B, an overlay degree of the first and second main overlay patterns 300 and 320 is measured using the optical microscope of the overlay measuring apparatus.

Figure 6:
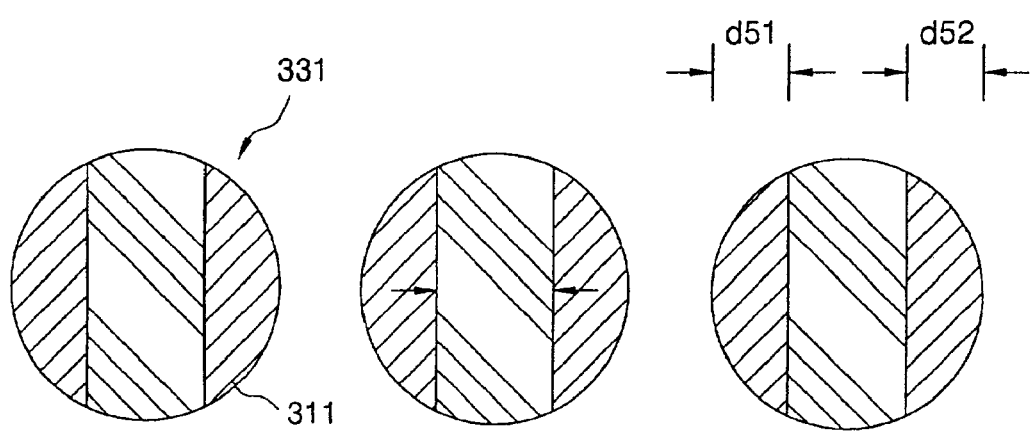
FIG. 6 shows images of the first and second auxiliary overlay patterns of FIGS. 4A to 4C taken by an in-line SEM.

Then, after the contact hole pattern 204 is formed in the interlayer insulator 203 as shown in FIG. 5E, the first auxiliary overlay pattern 310 and the second auxiliary overlay pattern 330 that are aligned with each other are inspected using the in-line SEM to obtain the images of FIG. 6. Distances d51 and d52 between the bar pattern 311 of the first auxiliary overlay pattern 310 and the hole pattern 331 of the second auxiliary overlay pattern 330 are measured using the in-line SEM, so that an overlay degree between the first and second auxiliary overlay patterns 310 and 330 is measured.

Thereafter, a degree of misalignment between the first and second main overlay patterns 300 and 320 is compared with a degree of misalignment between the first and second auxiliary overlay patterns 310 and 330.

As described above, in order to measure an overlay degree, this embodiment of the present invention uses two measurements, that is an optical measurement and an in-line SEM measurement. Therefore, an overlay degree between the previously formed layer and the currently formed layer can be measured even during a manufacturing process, and a measured overlay degree becomes highly accurate.

Figure 7A:
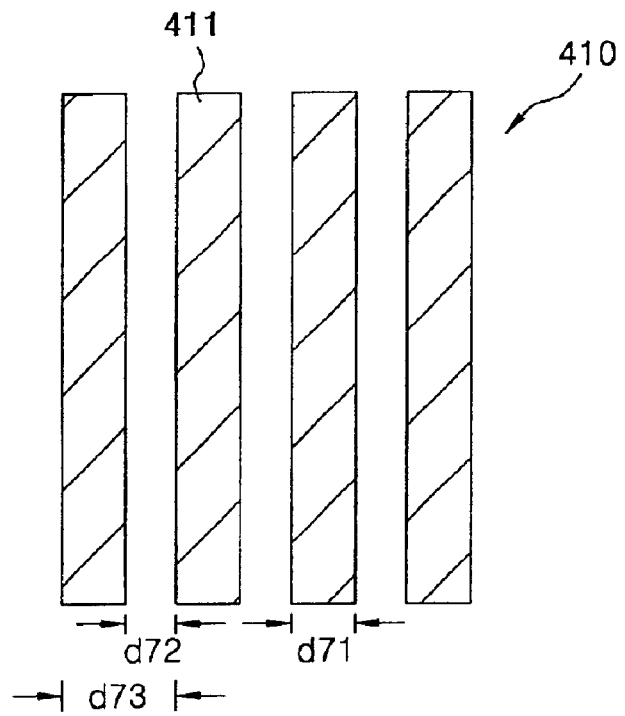
FIGS. 7A to 7C are plan views of first and second auxiliary overlay patterns according to a further embodiment of the present invention.
Figure 7B:
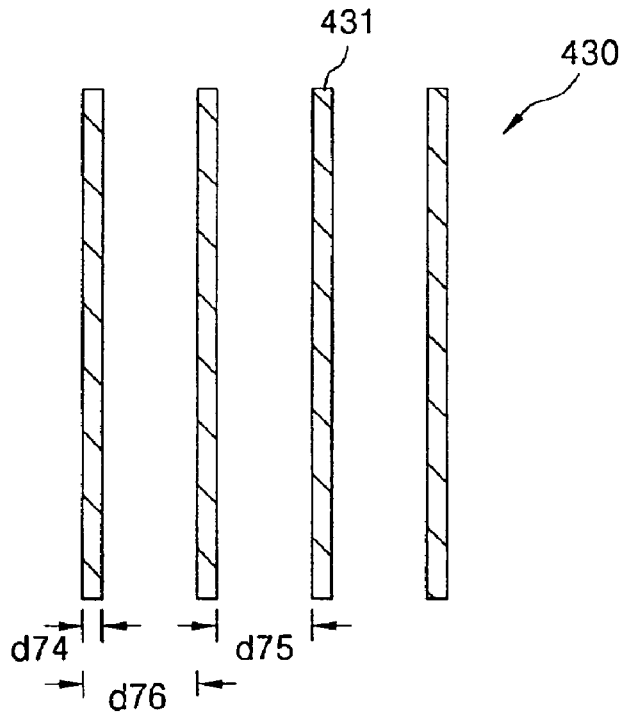
Figure 7C:
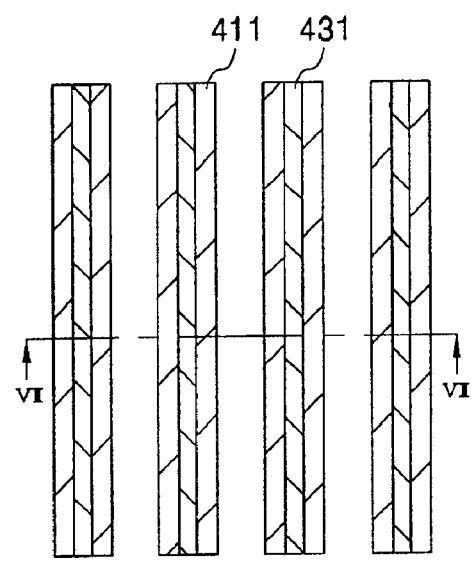

FIGS. 7A to 7C are plan views of a second embodiment of the first and second auxiliary overlay patterns according to another embodiment of the present invention. FIG. 7A is a plan view illustrating the first auxiliary overlay pattern. As shown in FIG. 7A, the first auxiliary overlay pattern 410 includes a plurality of first bar patterns 411, which are spaced apart from each other at a regular interval d72. The first bar pattern 411 has a width d71. The interval d72 plus the width d71 is "d73".

FIG. 7B is a plan view illustrating the second auxiliary overlay pattern. As shown in FIG. 7B, the second auxiliary overlay pattern 430 includes a plurality of second bar patterns 431, which are spaced apart from each other at a regular interval d75. The second bar pattern 431 has a width d74. The interval d75 plus the width d74 is "d76".

Preferably, the distance d73 is equal to the distance d76, and the width d71 of the first bar pattern 411 is larger than the width d74 of the second bar pattern 431, and the interval d72 is smaller than the interval d76. As shown in FIG. 7C, the first and second bar patterns 411 and 431 are arranged at corresponding locations with respect to each other.

Figure 8:
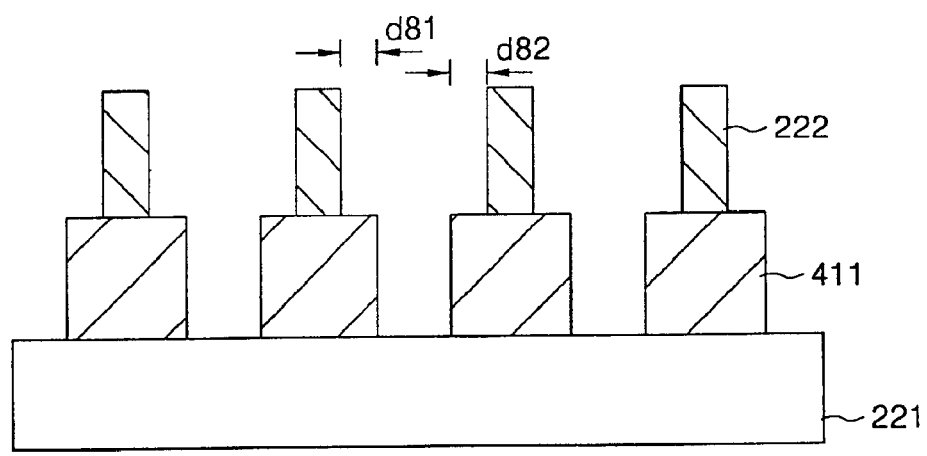
FIG. 8 is a cross-sectional view taken along line VIII—VIII of FIG. 7C.

FIG. 8 is a cross-sectional view taken along line VIII—VIII of FIG. 7C, illustrating the auxiliary overlay pattern completed after the second auxiliary overlay pattern 430 is copied to the interlayer insulator in order to measure an overlay degree using the in-line SEM. Patterns 222 of the interlayer insulator and the bar pattern 431 of the second auxiliary overlay pattern 430 have the same shape and arrangement. Therefore, an overlay degree can be measured by, respectively, measuring distances d81 and d82 between both edges of the pattern 222 of the interlayer insulator and both edges of the bar pattern 411 of the first auxiliary overlay pattern 410.

Figure 9A:
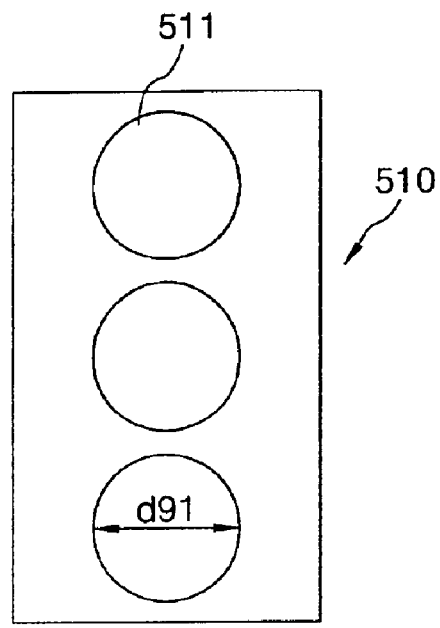
FIGS. 9A to 9C are plan views of first and second auxiliary overlay patterns according to another embodiment of the present invention.
Figure 9B:
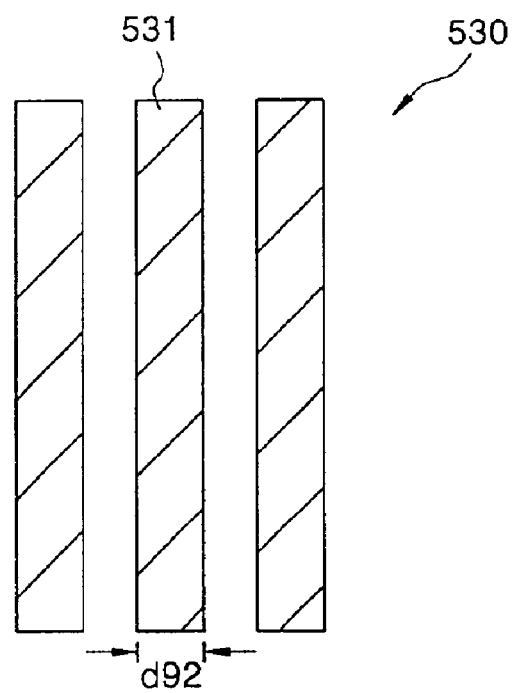
Figure 9C:
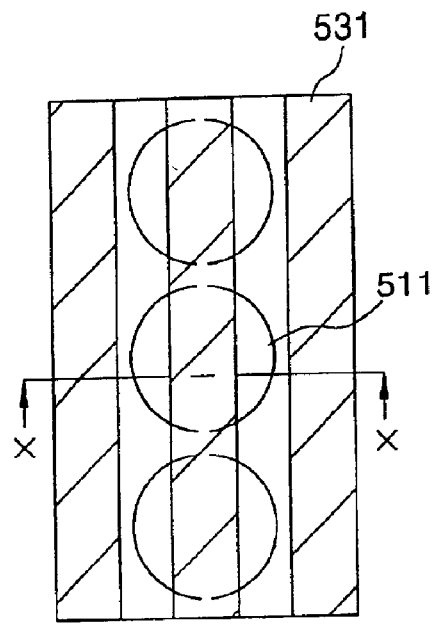

FIGS. 9A to 9C are plan views of a third embodiment of the first and second auxiliary overlay patterns. FIG. 9A is a plan view illustrating the first auxiliary overlay pattern. As shown in FIG. 9A, the first auxiliary overlay pattern 510 includes a plurality of hole patterns 511. The hole pattern 511 has a width d91. FIG. 9B is a plan view illustrating the second auxiliary overlay pattern. As shown in FIG. 9B, the second auxiliary overlay pattern 530 includes a plurality of bar patterns 531. The bar pattern 531 has a width d92.

As shown in FIG. 9C, the hole pattern 511 of the first auxiliary overlay pattern 510 and the bar pattern 531 of the second auxiliary overlay pattern 530 are arranged at corresponding locations with respect to each other. Preferably, the width d91 of the hole pattern 511 of the first auxiliary overlay pattern 510 is larger than the width d92 of the bar pattern 531 of the second auxiliary overlay pattern 530.

Figure 10:
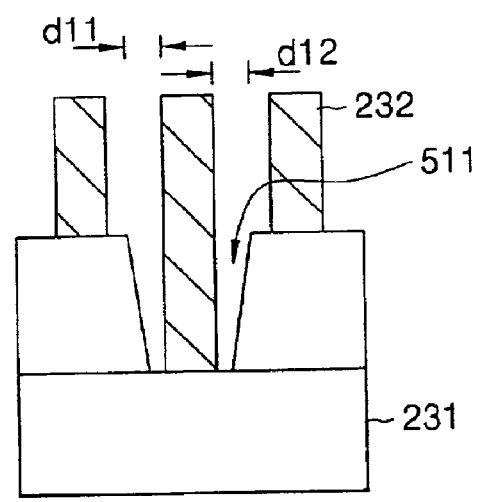
FIG. 10 is a cross-sectional view taken along line X—X of FIG. 9C.

FIG. 10 is a cross-sectional view taken along line X—X of FIG. 9C, illustrating the auxiliary overlay pattern completed after the second auxiliary overlay pattern 530 is copied to the interlayer insulator on wafer 231, in order to measure an overlay degree using the in-line SEM. Patterns 232 of the interlayer insulator and the bar pattern 531 of the second auxiliary overlay pattern 530 have the same shape and arrangement. Therefore, an overlay degree can be measuring by, respectively, measuring distances d11 and d12 between the corresponding pattern 232 of the interlayer insulator and the hole pattern 511 of the first auxiliary overlay pattern 510.

Figure 11A:
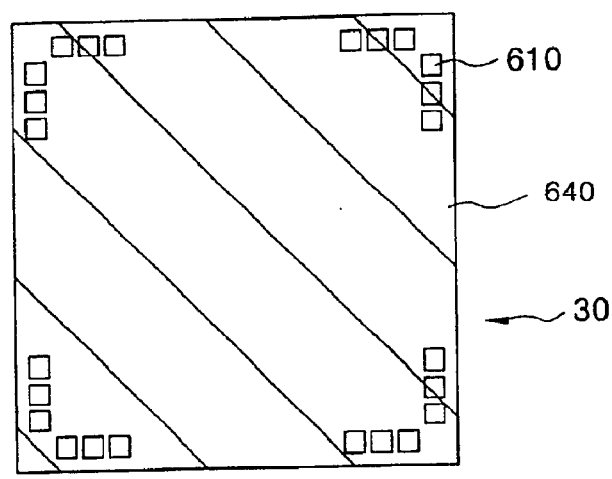
FIGS. 11A to 11C are plan views illustrating an overlay key according to a second embodiment of the present invention.
Figure 11B:
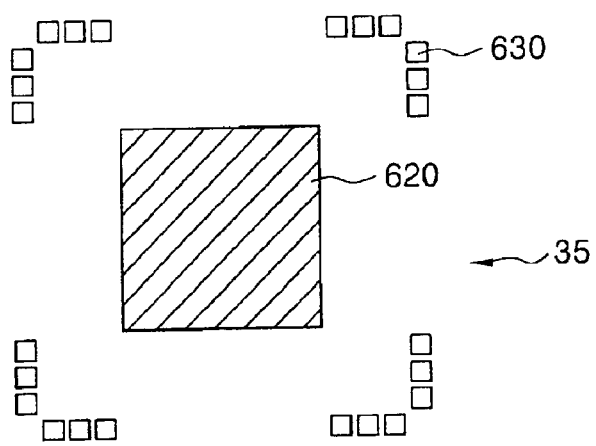
Figure 11C:
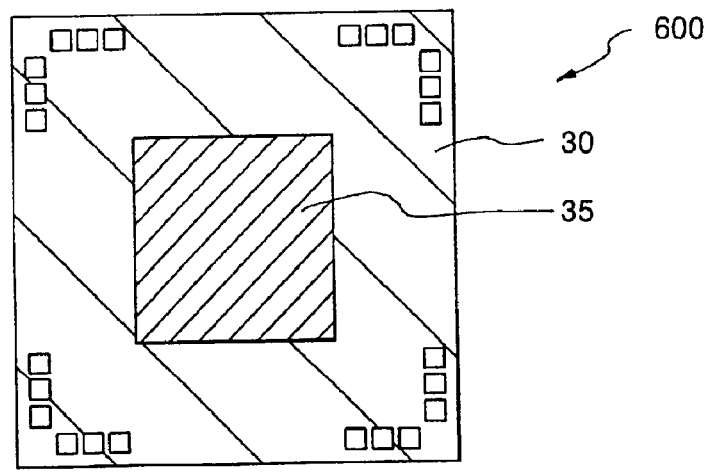

FIGS. 11A to 11C are plan views illustrating an overlay key according to a second preferred embodiment of the present invention. As shown in FIGS. 11A and 11B, the overlay key 600 includes first and second overlay keys 30 and 35. The first and second overlay keys 30 and 35 have a rectangular shape. The first overlay key 30 includes a first main overlay pattern 640 and a first auxiliary overlay pattern 610. The second overlay key 35 also includes a second main overlay pattern 620 and a second auxiliary overlay pattern 630. The first auxiliary overlay pattern 610 is formed on a portion of the first overlay key 30 that is not defined by imaginary lines extended outwardly from two parallel outside lines of the second overlay key 35 and does not correspond to respective sides of the second overlay key 35. That is, the first auxiliary overlay pattern 610 is formed at a corner portion of the first overlay key 30. The second auxiliary overlay pattern 630 of the second overlay key 35 is formed at a location corresponding to the first auxiliary overlay pattern 610. Also, a length of the first main overlay pattern 640 may be equal to or larger than a length of a corresponding side of the second main overlay pattern 620.

Therefore, as shown in FIG. 11C, when the first and second overlay keys 30 and 35 are aligned with each other, the first main overlay pattern 640 corresponds to the second main overlay pattern 620, and the first auxiliary overlay pattern 610 corresponds to the second auxiliary overlay pattern 630.

At this point, the first and second main overlay patterns 640 and 620 are used to measure, using the overlay measuring apparatus, a degree of misalignment of the first and second overlay keys, i.e., an overlay degree between a previously formed layer and a currently formed layer. The first and second auxiliary overlay patterns 610 and 630 are used to measure, using an in-line SEM, an overlay degree between the first and second overlay keys 30 and 35.

The first and second auxiliary overlay patterns 610 and 630 can have various kinds of shapes as shown in FIGS. 4A to 4C, 7A to 7C and 9A to 9C.

Figure 12A:
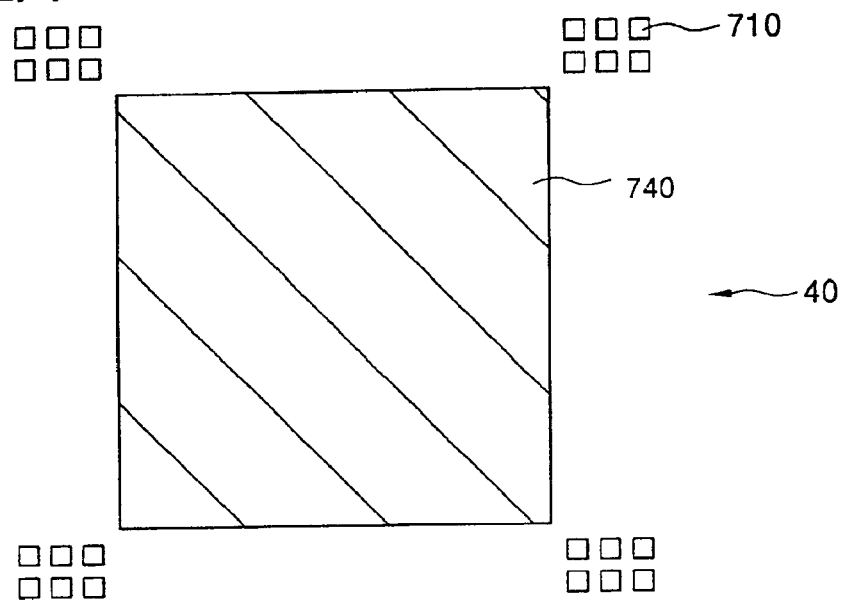
FIGS. 12A to 12C are plan views illustrating an overlay key according to a third embodiment of the present invention.
Figure 12B:
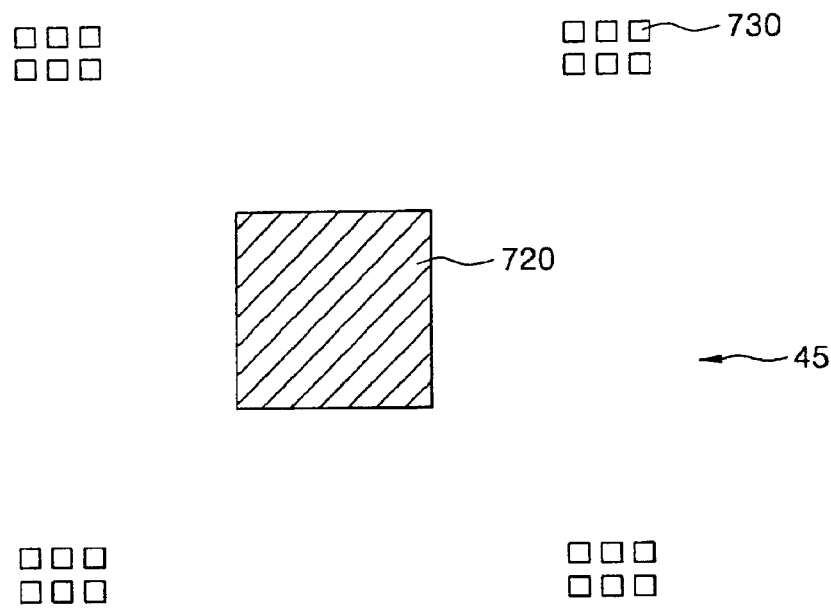
Figure 12C:
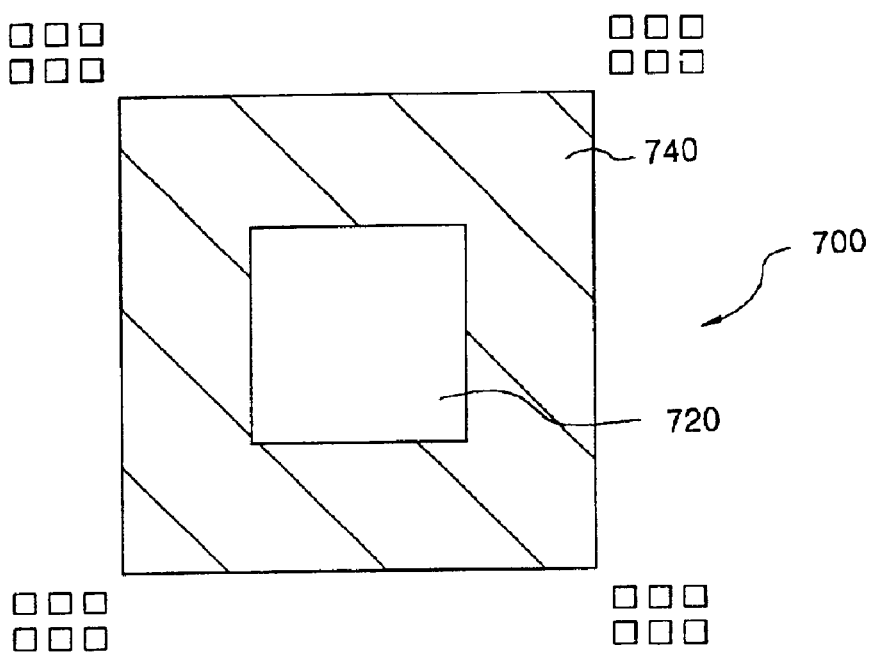

FIGS. 12A to 12C are plan views illustrating an overlay key according to a third embodiment of the present invention. As shown in FIGS. 12A and 12B, the overlay key 700 includes first and second overlay keys 40 and 45. The first and second overlay keys 40 and 45 have a rectangular shape. The first overlay key 40 includes a first main overlay pattern 740 and a first auxiliary overlay pattern 710. The second overlay key 45 includes a second main overlay pattern 720 and a second auxiliary overlay pattern 730.

The first auxiliary overlay pattern 710 is formed on a region outside the first main overlay pattern 740 that is not defined by imaginary lines extended outwardly from two parallel outside lines of the second overlay key 45 and does not correspond to respective sides of the second overlay key 45. That is, the first auxiliary overlay pattern 710 is formed at a portion outside the first main overlay pattern 740 adjacent to the corner of the first overlay key 40. The second auxiliary overlay pattern 730 of the second overlay key 45 is formed at a location corresponding to the first auxiliary overlay pattern 710. Also, a length of the first main overlay pattern 740 may be equal to or larger than a length of a corresponding side of the second main overlay pattern 720.

Therefore, as shown in FIG. 12C, when the first and second overlay keys 40 and 45 are aligned with each other, the first main overlay pattern 740 corresponds to the second main overlay pattern 720, and the first auxiliary overlay pattern 710 corresponds to the second auxiliary overlay pattern 730.

At this point, the first and second main overlay patterns 740 and 720 are used to measure, using the overlay measuring apparatus, a degree of misalignment of the first and second overlay keys, i.e., an overlay degree between a previously formed layer and a currently formed layer. The first and second auxiliary overlay patterns 710 and 730 are used to measure, using an in-line SEM, an overlay degree between the first and second overlay keys 40 and 45.

The first and second auxiliary overlay patterns 710 and 730 can have various kinds of shapes as shown in FIGS. 4A to 4C, 7A to 7C and 9A to 9C.

Figure 13A:
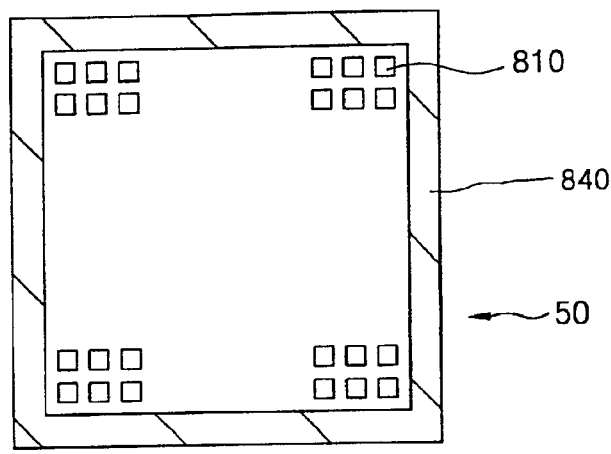
FIGS. 13A to 13C are plan views illustrating an overlay key according to a fourth embodiment of the present invention.
Figure 13B:
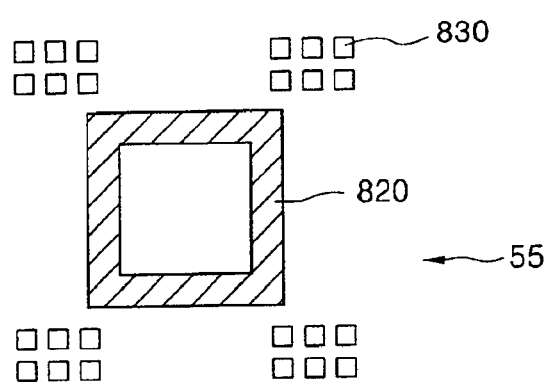
Figure 13C:
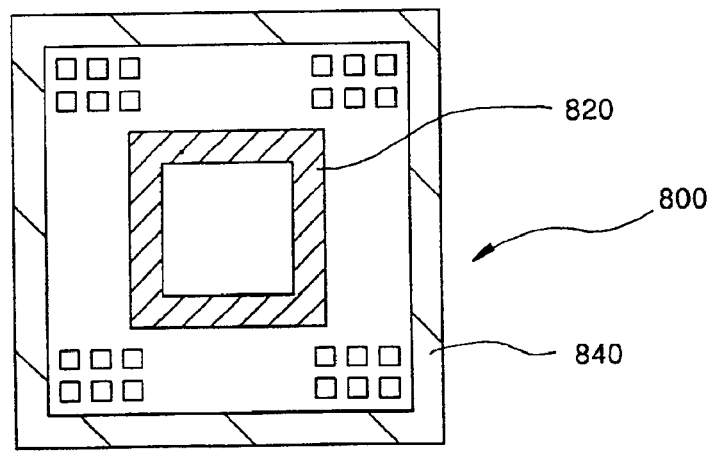

FIGS. 13A to 13C are plan views illustrating an overlay key according to a fourth embodiment of the present invention. As shown in FIGS. 13A and 13B, the overlay key 800 includes first and second overlay keys 50 and 55. The first and second overlay keys 50 and 55 have a frame shape. The first overlay key 50 includes a first main overlay pattern 840 and a first auxiliary overlay pattern 810. The second overlay key 55 includes a second main overlay pattern 820 and a second auxiliary overlay pattern 830.

The first auxiliary overlay pattern 810 is formed on a region inside the first main overlay pattern 840 that is not defined by imaginary lines extended outwardly from two parallel outside lines of the second overlay key 55. That is, the first auxiliary overlay pattern 810 is formed at a portion inside the first main overlay pattern 840 adjacent to the corner of the first overlay key 50. The second auxiliary overlay pattern 830 of the second overlay key 55 is formed at a location corresponding to the first auxiliary overlay pattern 810.

Therefore, as shown in FIG. 13C, when the first and second overlay keys 50 and 55 are aligned with each other, the first main overlay pattern 840 corresponds to the second main overlay pattern 820, and the first auxiliary overlay pattern 810 corresponds to the second auxiliary overlay pattern 830.

At this point, the first and second main overlay patterns 840 and 820 are used to measure, using the overlay measuring apparatus, a degree of misalignment of the first and second overlay keys, i.e., an overlay degree between a previously formed layer and a currently formed layer. The first and second auxiliary overlay patterns 810 and 830 are used to measure, using an in-line SEM, an overlay degree between the first and second overlay keys 50 and 55.

The first and second auxiliary overlay patterns 810 and 830 can have various kinds of shapes as shown in FIGS. 4A to 4C, 7A to 7C and 9A to 9C.

Figure 14A:
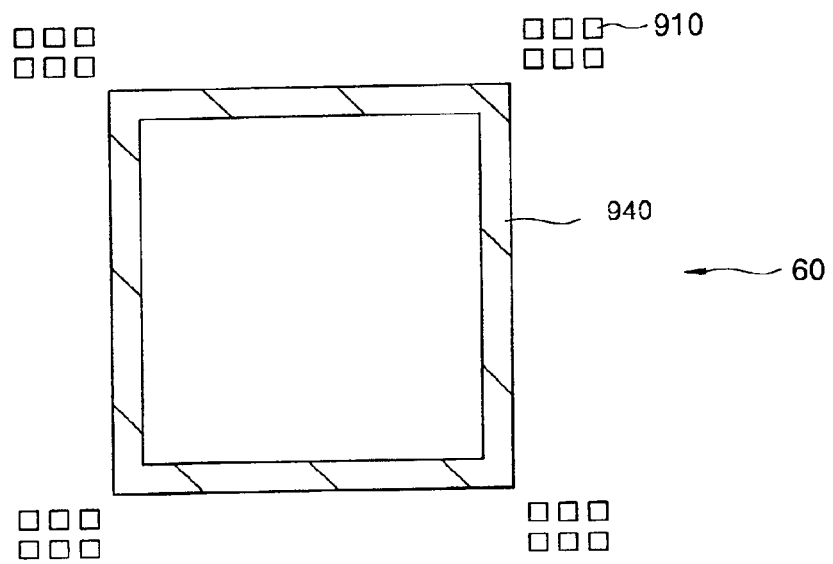
FIGS. 14A to 14C are plan views illustrating an overlay key according to a fifth embodiment of the present invention.
Figure 14B:
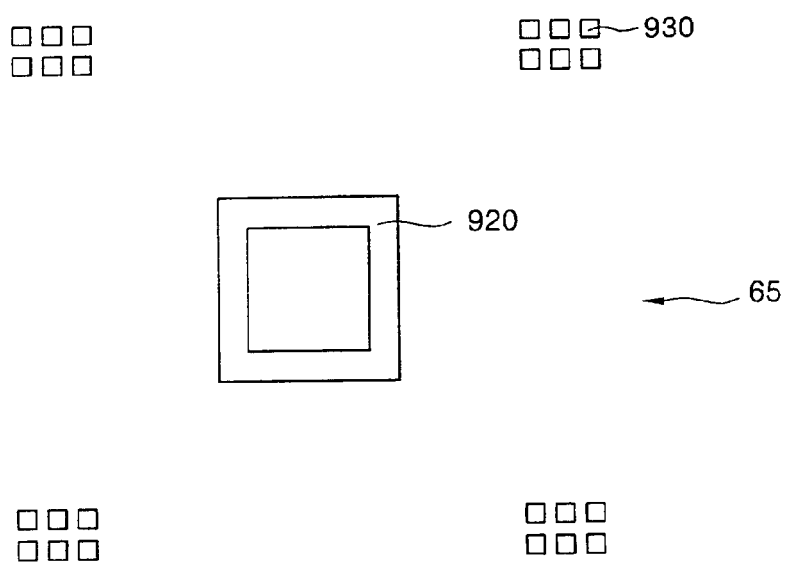
Figure 14C:
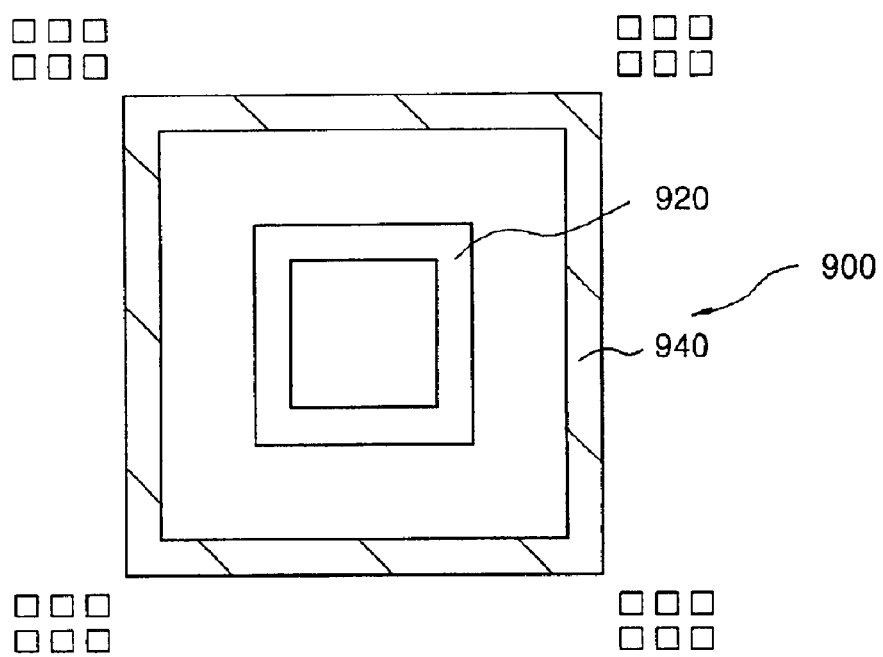

FIGS. 14A to 14C are plan views illustrating an overlay key according to a fifth embodiment of the present invention. As shown in FIGS. 14A and 14B, the overlay key 900 includes first and second overlay keys 60 and 65. The first and second overlay keys 60 and 65 have a frame shape. The first overlay key 60 includes a first main overlay pattern 940 and a first auxiliary overlay pattern 910. The second overlay key 65 includes a second main overlay pattern 920 and a second auxiliary overlay pattern 930.

The first auxiliary overlay pattern 910 is formed on a region outside the first main overlay pattern 940 that is not defined by imaginary lines extended outwardly from two parallel outside lines of the second overlay key 65. That is, the first auxiliary overlay pattern 910 is formed at a portion outside the first main overlay pattern 940 adjacent to the corner of the first overlay key 60. The second auxiliary overlay pattern 930 of the second overlay key 65 is formed at a location corresponding to the first auxiliary overlay pattern 910.

Therefore, as shown in FIG. 14C, when the first and second overlay keys 60 and 65 are aligned with each other, the first main overlay pattern 940 corresponds to the second main overlay pattern 920, and the first auxiliary overlay pattern 910 corresponds to the second auxiliary overlay pattern 930.

At this point, the first and second main overlay patterns 940 and 920 are used to measure, using the overlay measuring apparatus, a degree of misalignment of the first and second overlay keys, i.e., an overlay degree between a previously formed layer and a currently formed layer. The first and second auxiliary overlay patterns 910 and 930 are used to measure, using an in-line SEM, an overlay degree between the first and second overlay keys 60 and 65.

The first and second auxiliary overlay patterns 910 and 930 can have various kinds of shapes as shown in FIGS. 4A to 4C, 7A to 7C and 9A to 9C.

As described above, since the overlay key includes main overlay patterns used to measure an overlay degree using an optical method, and auxiliary overlay patterns used to measure an overlay degree using an in-line SEM, an overlay degree can be very accurately measured, and also can be measured during a manufacturing process.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An overlay key, comprising:
   a first overlay key having a first main overlay pattern and a first auxiliary overlay pattern; and
   a second overlay key having a second main overlay pattern and a second auxiliary overlay pattern, the second auxiliary overlay pattern being formed at a location corresponding to the first auxiliary overlay pattern.

2. The overlay key of claim 1, wherein the first and second overlay keys have a frame shape.

3. The overlay key of claim 2, wherein the first auxiliary overlay pattern is formed at a corner portion of the first overlay key.

4. The overlay key of claim 3, wherein a length of the first main overlay pattern is equal to a length of a corresponding side of the second main overlay pattern.

5. The overlay key of claim 4, wherein the first main overlay pattern is defined by imaginary lines extended from two parallel outside lines of the second main overlay pattern.

6. The overlay key of claim 1, wherein the first auxiliary overlay pattern includes a plurality of bar patterns spaced apart from each other.

7. The overlay key of claim 6, wherein the second auxiliary overlay pattern includes a plurality of hole patterns spaced apart from each other.

8. The overlay key of claim 7, wherein an interval between two adjacent bar patterns is larger than a width of the hole pattern.

9. The overlay key of claim 6, wherein the second auxiliary overlay pattern includes a plurality of second bar patterns having a smaller width than the bar patterns.

10. The overlay key of claim 1, wherein the first auxiliary overlay pattern includes a plurality of hole patterns.

11. The overlay key of claim 10, wherein the second auxiliary overlay pattern includes a plurality of bar patterns.

12. The overlay key of claim 11, wherein a width of the hole pattern of the first auxiliary overlay pattern is larger than a width of the bar pattern of the second auxiliary overlay pattern.

13. The overlay key of claim 2, wherein the first auxiliary overlay pattern is formed at a location adjacent to a corner portion of the first overlay key.

14. The overlay key of claim 13, wherein a length of the first main overlay pattern is equal to a length of a corresponding side of the second main overlay pattern.

15. The overlay key of claim 14, wherein the first main overlay pattern is defined by imaginary lines extended from two parallel outside lines of the second main overlay pattern.

16. The overlay key of claim 1, wherein the first and second overlay keys have a substantially rectangular shape.

17. The overlay key of claim 16, wherein the first auxiliary overlay pattern is formed on a corner portion of the first overlay key.

18. The overlay key of claim 17, wherein a length of the first main overlay pattern is equal to a length of a corresponding side of the second main overlay pattern.

19. The overlay key of claim 18, wherein the first main overlay pattern is defined by imaginary lines extended from two parallel outside lines of the second main overlay pattern.

20. The overlay key of claim 16, wherein the first auxiliary overlay pattern is formed at a location adjacent to a corner portion of the first overlay key.

21. The overlay key of claim 20, wherein a length of the first main overlay pattern is equal to a length of a corresponding side of the second main overlay pattern.

22. The overlay key of claim 21, wherein the first main overlay pattern is defined by imaginary lines extended from two parallel outside lines of the second main overlay pattern.

23. The overlay key of claim 1, wherein the first and second main overlay patterns are for measuring an overlay degree using an optical microscope, and the first and second auxiliary overlay patterns are for measuring an overlay degree using an in-line SEM (scanning electron microscope).

24. An overlay key, comprising:
- a first overlay key on a first layer having a first main overlay pattern and a first auxiliary overlay pattern; and
- a second overlay key on a second layer above the first layer, having a second main overlay pattern and a second auxiliary overlay pattern,
- wherein, when viewed from above, at least some portion of the second auxiliary overlay pattern directly overlies at least some portion of the first auxiliary overlay pattern.

25. The overlay key of claim 24, wherein the first auxiliary overlay pattern includes a plurality of bar patterns spaced apart from each other.

26. The overlay key of claim 25, wherein the second auxiliary overlay pattern includes a plurality of hole patterns spaced apart from each other.

27. The overlay key of claim 26, wherein an interval between two adjacent bar patterns is larger than a width of the hole pattern.

28. The overlay key of claim 25, wherein the second auxiliary overlay pattern includes a plurality of second bar patterns having a smaller width than the bar patterns.

29. The overlay key of claim 24, wherein the first auxiliary overlay pattern includes a plurality of hole patterns.

30. The overlay key of claim 29, wherein the second auxiliary overlay pattern includes a plurality of bar patterns.

31. The overlay key of claim 30, wherein a width of the hole pattern of the first auxiliary overlay pattern is larger than a width of the bar pattern of the second auxiliary overlay pattern.

* * * * *